(12) United States Patent
Chiu et al.

(10) Patent No.: US 11,587,875 B2
(45) Date of Patent: Feb. 21, 2023

(54) CONNECTING STRUCTURE AND METHOD FOR FORMING THE SAME

(71) Applicant: TAIWAN SEMICONDUCTOR MANUFACTURING COMPANY LTD., Hsinchu (TW)

(72) Inventors: U-Ting Chiu, Hsinchu (TW); Yu-Shih Wang, Tainan (TW); Chun-Cheng Chou, Taichung (TW); Yu-Fang Huang, Hsinchu (TW); Chun-Neng Lin, Hsin-Chu (TW); Ming-Hsi Yeh, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 57 days.

(21) Appl. No.: 16/990,940

(22) Filed: Aug. 11, 2020

(65) Prior Publication Data

US 2022/0051982 A1 Feb. 17, 2022

(51) Int. Cl.
| | |
|---|---|
| *H01L 23/535* | (2006.01) |
| *H01L 27/11* | (2006.01) |
| *H01L 23/528* | (2006.01) |
| *H01L 21/768* | (2006.01) |
| *H01L 21/3213* | (2006.01) |
| *H01L 21/311* | (2006.01) |

(52) U.S. Cl.
CPC ...... *H01L 23/535* (2013.01); *H01L 21/31116* (2013.01); *H01L 21/32134* (2013.01); *H01L 21/76805* (2013.01); *H01L 21/76892* (2013.01); *H01L 21/76895* (2013.01); *H01L 23/5283* (2013.01); *H01L 27/1104* (2013.01); *H01L 27/1116* (2013.01)

(58) Field of Classification Search
CPC .................. H01L 21/76805; H01L 23/535
See application file for complete search history.

(56) References Cited

U.S. PATENT DOCUMENTS

| | | | |
|---|---|---|---|
| 10,083,863 B1* | 9/2018 | Hsieh | H01L 23/485 |
| 2003/0194872 A1* | 10/2003 | Parikh | H01L 21/76868 |
| | | | 257/E21.585 |
| 2018/0068889 A1* | 3/2018 | Choi | H01L 21/76879 |

* cited by examiner

*Primary Examiner* — Farun Lu
(74) *Attorney, Agent, or Firm* — WPAT; Anthony King

(57) ABSTRACT

A connecting structure includes a substrate, a first conductive feature, a second conductive feature, a third conductive feature over the first conductive feature and a fourth conductive feature over the second conductive feature. The substrate includes a first region and a second region. The first conductive feature is disposed in the first region and has a first width. The second conductive feature is disposed in the second region and has a second width greater than the first width of the first conductive feature. The third conductive feature includes a first anchor portion surrounded by the first conductive feature. The fourth conductive feature includes a second anchor portion surrounded by the second conductive feature. A depth difference ratio between a depth of the first anchor portion and a depth of the second anchor portion is less than approximately 10%.

20 Claims, 11 Drawing Sheets

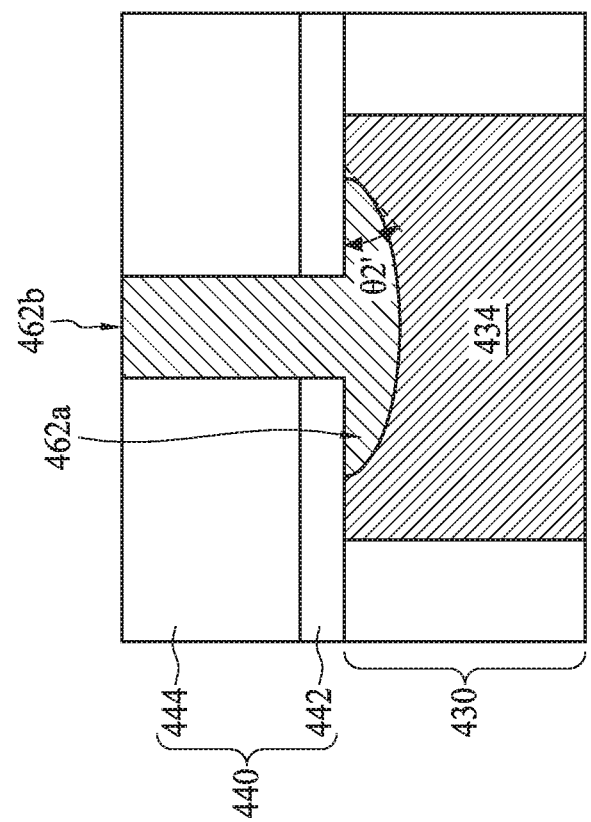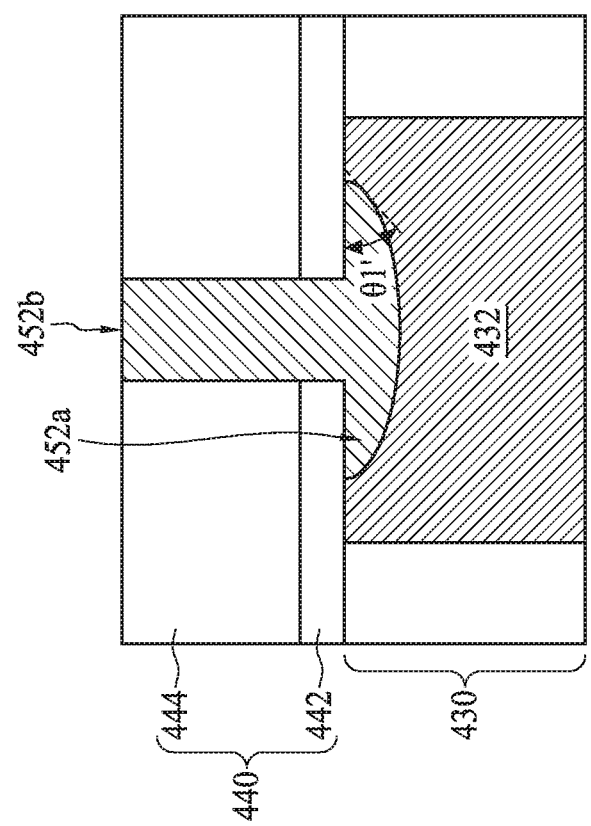
FIG. 4G

CONNECTING STRUCTURE AND METHOD FOR FORMING THE SAME

BACKGROUND

The semiconductor integrated circuit (IC) industry has experienced rapid growth. Technological advances in IC materials and design have produced continuous improvements in generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, as the feature sizes continue to decrease, fabrication processes continue to become more difficult to perform. Thus, there is a challenge to form reliable semiconductor devices with smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A to 4G are schematic drawings illustrating various stages in a method for forming a connecting structure according to aspects of one or more embodiments of the present disclosure, wherein.

FIG. 4D is a partial enlarged view of FIG. 4C, and FIG. 4G is a partial enlarged view of FIG. 4F.

DETAILED DESCRIPTION

Figure 1:
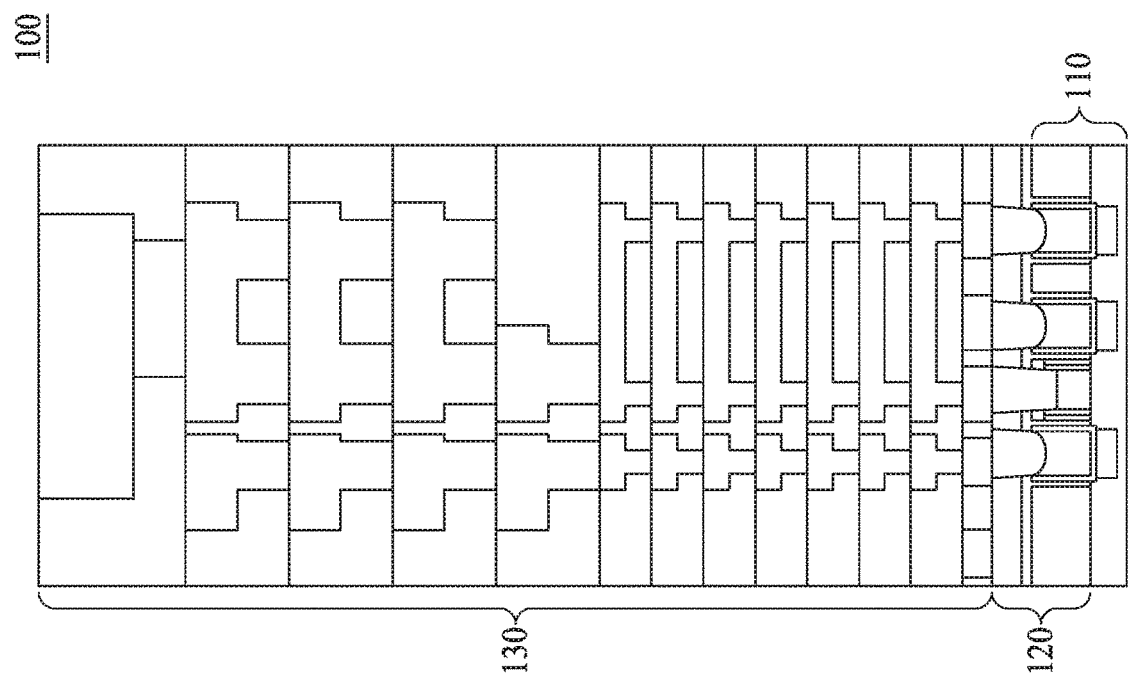
FIG. 1 is a fragmentary cross-sectional view of a semiconductor structure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

FIG. 1 is a fragmentary cross-sectional view of a semiconductor structure 100. In some embodiments, an IC manufacturing process flow can typically be divided into three categories: front-end-of-line (FEOL), middle-end-of-line (MEOL) and back-end-of-line (BEOL). FEOL generally encompasses processes related to fabrication of IC devices, such as transistors. For example, FEOL processes can include formation of isolation structures for isolating IC devices, gate structures, and source and drain structures (also referred to as source/drain structures) that form a transistor. In some embodiments, the devices formed by the FEOL processes can be referred to as FEOL devices 110. MEOL generally encompasses processes related to fabrication of connecting structures (also referred to as contacts or plugs) that connect to conductive features (or conductive regions) of the IC devices. For example, MEOL processes can include formation of connecting structures that connect to the gate structures and connecting structures that connect to the source/drain structures. In some embodiments, the connecting structures formed by the MEOL processes can be referred to as MEOL structures 120. BEOL generally encompasses processes related to fabrication of multilayer interconnect (MLI) structures that electrically connect the IC devices to the connecting structures fabricated by FEOL and MEOL. In some embodiments, the MLI structures formed by the BEOL processes can be referred to as BEOL structures 130. Accordingly, a semiconductor structure 100 can be constructed by the FEOL devices 110, the MEOL structures 120 and the BEOL structures 130, and operation of the IC devices can be enabled.

As mentioned above, the FEOL devices 110 are formed in the FEOL process. In some comparative approaches in the FEOL process, a semiconductor substrate may be received. The semiconductor substrate may include regions for accommodating different FEOL devices. For example, the semiconductor substrate may include a region for accommodating memory devices, a region for accommodating high-voltage (HV) devices, a region for accommodating input/output (IO) deices, and a region for accommodating logic (core) devices. Different devices may have different dimension requirements not only in the FEOL process but also in the MEOL process. Further, the dimension requirements for FEOL devices 110 in different regions or MEOL structures 120 in different regions of one semiconductor substrate cause difficulty in both the FEOL and the MEOL processes. In some embodiments, different dimension further cause a uniformity issues due to loading effect.

The present disclosure therefore provides connecting structures and a method for forming the connecting structures that is able to mitigate the uniformity issues.

Figure 2:
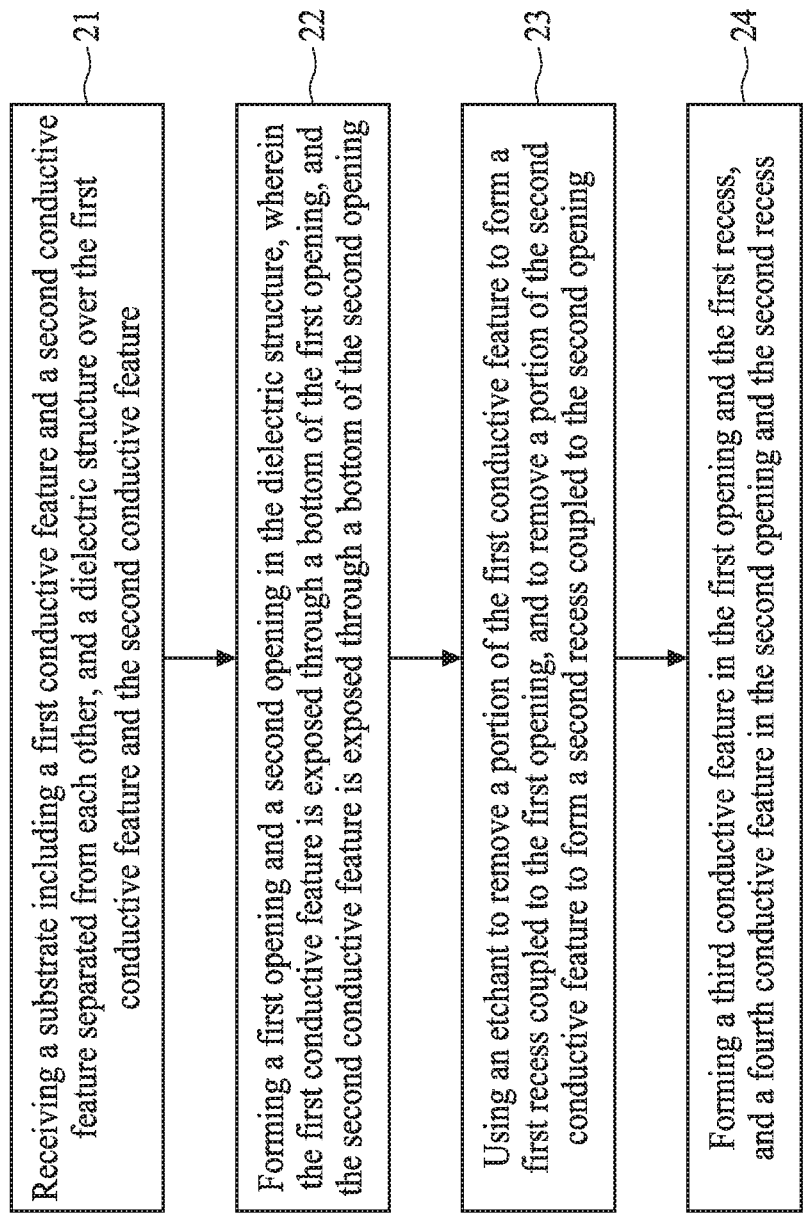
FIG. 2 is a flowchart of a method for forming a connecting structure according to various aspects of the present disclosure.

FIG. 2 is a flowchart representing a method for forming a connecting structure according to aspects of the present disclosure. In some embodiments, the method for forming the connecting structure 20 can be used in a method for forming a connecting structure such as the MEOL interconnect structure mentioned above.

Figure 3:
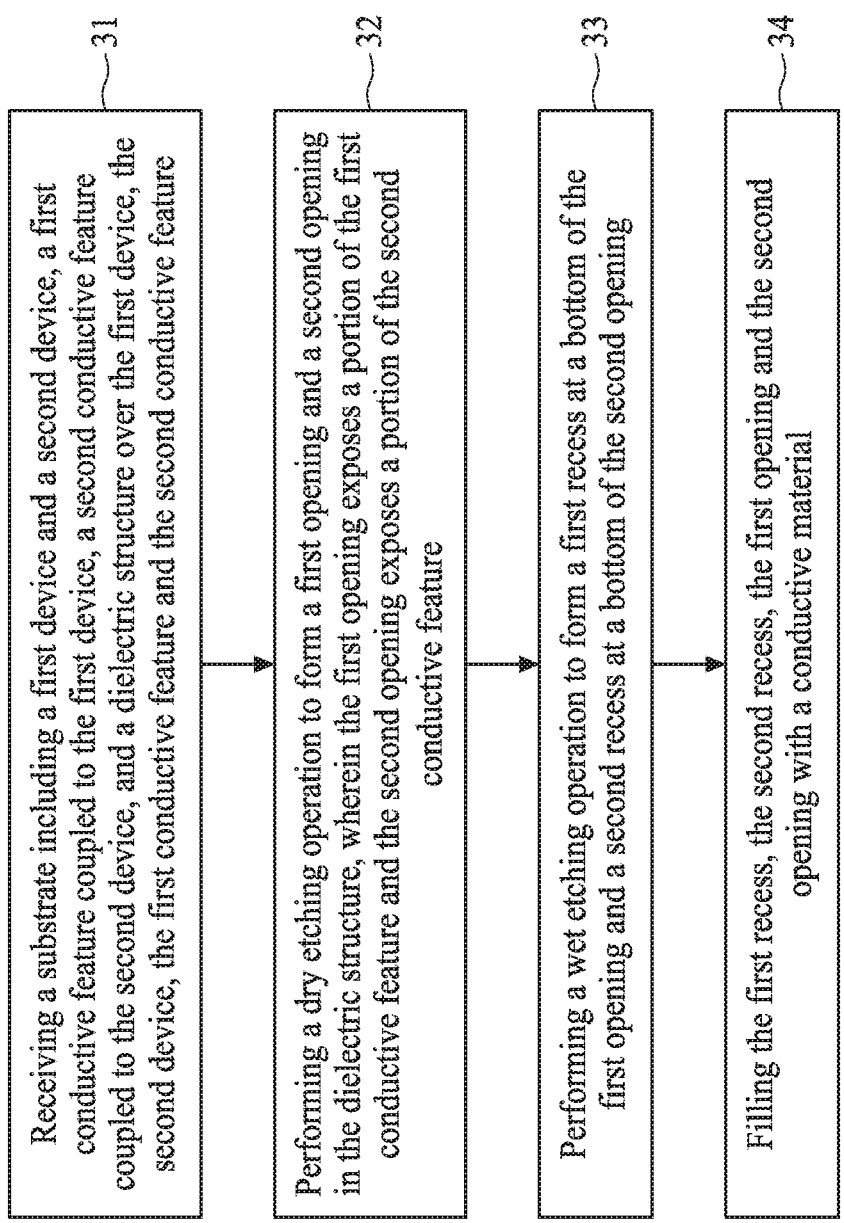
FIG. 3 is a flowchart of a method for forming a connecting structure according to various aspects of the present disclosure.

FIG. 3 is a flowchart representing a method for forming a connecting structure 30 according to aspects of the present disclosure. In some embodiments, the method for forming the connecting structure 30 can be provided to form a connecting structure such as the MEOL interconnect structure mentioned above.

In some embodiments, the method for forming the connecting structure 20 includes a number of operations (21, 22, 23 and 24), and the method for forming the connecting structure 30 includes a number of operations (31, 32, 33 and 34). The method for forming the connecting structure 20 and the method for forming the connecting structure 30 will be further described according to one or more embodiments. It should be noted that the operations of the method for forming the connecting structure 20 and the method for forming the connecting structure 30 may be rearranged or otherwise modified within the scope of the various aspects. It should further be noted that additional processes may be provided before, during, and after the methods 20 and 30, and that some other processes may be only briefly described herein.

FIGS. 4A to 4G are schematic drawings illustrating various stages in a method for forming a connecting structure according to aspects of one or more embodiments of the present disclosure. In some embodiments, FIGS. 4A to 4G are fragmentary cross-sectional views of a semiconductor structure 400, in portion or entirety, according to various aspects of the present disclosure. In operation 21 or operation 31, a substrate 402 is received. In some embodiments, the substrate 402 includes silicon. Alternatively or additionally, the substrate 402 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or a combination thereof. In some implementations, the substrate 402 includes one or more group III-V materials, one or more group II-IV materials, or a combination thereof. In some implementations, the substrate 402 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 402 can include various doped regions (not shown) configured according to design requirements of a device, such as p-type doped regions, n-type doped regions, or combinations thereof. P-type doped regions (for example, p-type wells) include p-type dopants, such as boron, indium, another p-type dopant, or a combination thereof. N-type doped regions (for example, n-type wells) include n-type dopants, such as phosphorus, arsenic, another n-type dopant, or a combination thereof. In some implementations, the substrate 402 includes doped regions formed with a combination of p-type dopants and n-type dopants. The various doped regions can be formed directly on and/or in the substrate 402, for example, providing a p-well structure, an n-well structure, a dual-well structure, a raised structure, or a combination thereof. An ion implantation process, a diffusion process, and/or another suitable doping process can be performed to form the various doped regions.

Isolations (not shown) can be formed over and/or in the substrate 402 to electrically isolate various regions, such as various device regions, of the semiconductor structure 400. For example, the isolations can define and electrically isolate active device regions and/or passive device regions from each other. The isolations can include silicon oxide, silicon nitride, silicon oxynitride, another suitable isolation material, or combinations thereof. Isolation features can include different structures, such as shallow trench isolation (STI) structures, deep trench isolation (DTI) structures, and/or local oxidation of silicon (LOCOS) structures. For example but not limited thereto, the substrate 402 can include a first region 404 and a second region 406 that are defined and electrically isolated from other functional regions by the STIs. In some embodiments, the first region 404 can be a memory array region and the second region 406 can be a peripheral region or a logic region. In some embodiments, the memory array region 404 can be a region for accommodating a plurality of static random access memory (SRAM) cells, but the disclosure is not limited thereto. In some embodiments, the second region 406 can be the logic region that includes circuitry for processing information received from memory cells and for controlling reading and writing functions of the memory structures. In other embodiments, the second region 406 can be the peripheral region that includes IO devices.

Figure 4A:
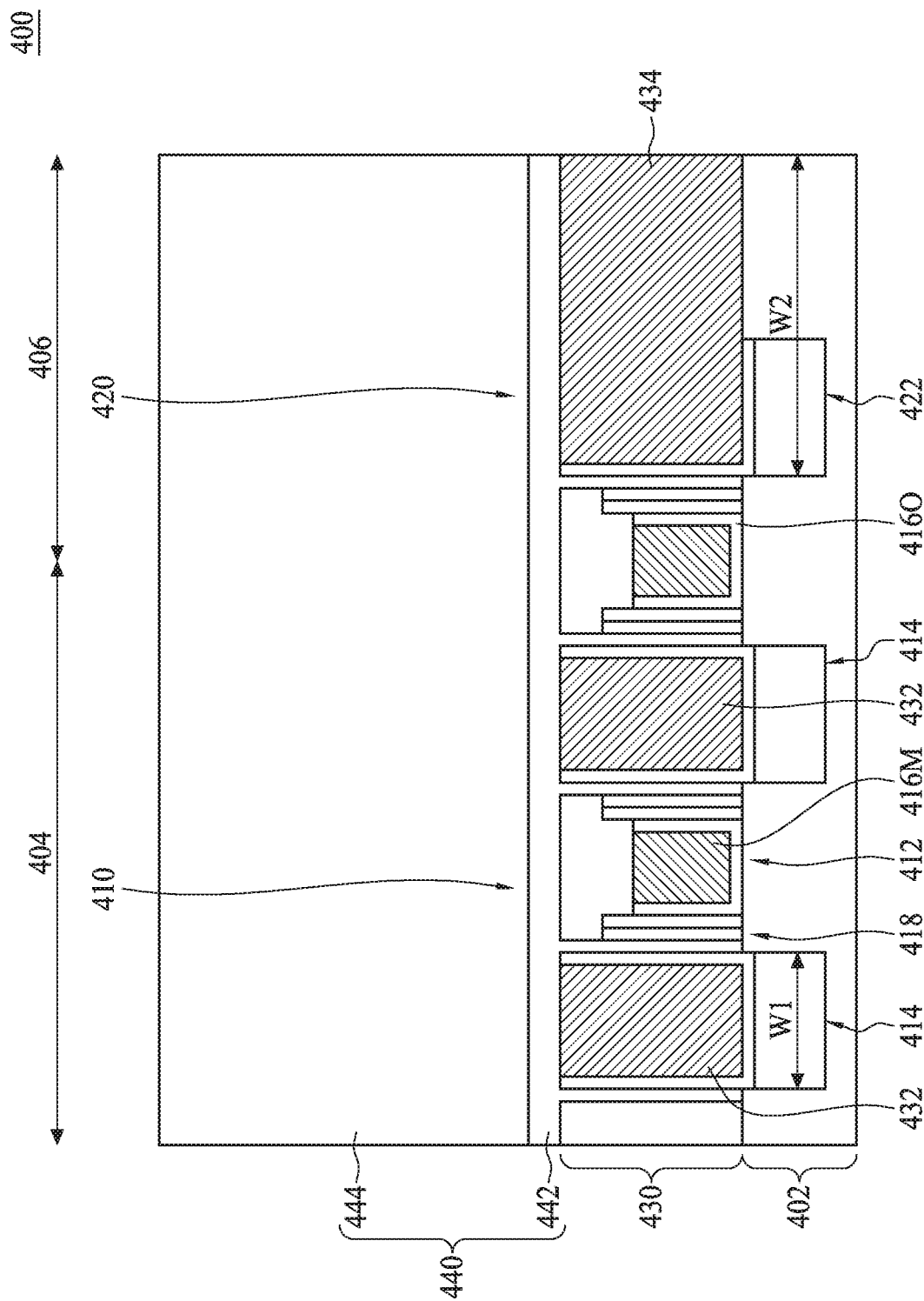

As shown in FIG. 4A, in operation 31, a first device 410 can be disposed in the first region 404 and a second device 420 can be disposed in the second region 406. The first device 410 can include a gate structure 412 and source/drain structures 414 disposed at two sides of the gate structure 412. The second device 420 can include a gate structure (not shown) and source/drain structures 422 at two sides of the gate structure. In some embodiments, the gate structure 412 can be formed over a fin structure while the source/drain structures 414 can be formed in the fin structure. In some embodiments, the gate structure 412 can include a metal gate structure. In some embodiments, the metal gate structure includes a gate dielectric layer 416O and a metal stack 416M including at least a work function metal layer over the gate dielectric layer and a contact metal layer over the work function metal layer. The gate dielectric layer 416O can be disposed over the substrate 402, and the metal stack 416M is disposed on the gate dielectric layer 416O. The gate dielectric layer 416O includes a dielectric material, such as silicon oxide, high-k dielectric material, another suitable dielectric material, or a combination thereof. High-k dielectric material generally refers to dielectric materials having a high dielectric constant, for example, greater than a dielectric constant of silicon oxide (k≈3.9). Exemplary high-k dielectric materials include hafnium, aluminum, zirconium, lanthanum, tantalum, titanium, yttrium, oxygen, nitrogen, another suitable constituent, and combinations thereof. In some embodiments, the gate dielectric layer includes a multilayer structure, such as an interfacial layer (IL) including, for example, silicon oxide, and a high-k dielectric layer including, for example, $HfO_2$, HfSiO, HfSiON, HfTaO, HfTiO, HfZrO, ZrO$_2$, Al$_2$O$_3$, HfO$_2$—Al$_2$O$_3$, TiO$_2$, Ta$_2$O$_5$, La$_2$O$_3$, Y$_2$O$_3$, another suitable high-k dielectric material, or a combination thereof.

The work function metal layer of the metal stack 416M includes a conductive material tuned to have a desired work function (such as an n-type work function or a p-type work function), such as an n-type work function material and/or a p-type work function material. P-type work function materials include TiN, TaN, Ru, Mo, Al, WN, ZrSi$_2$, MoSi$_2$, TaSi$_2$, NiSi$_2$, WN, another p-type work function material, or combinations thereof. N-type work function materials include Ti, Al, Ag, Mn, Zr, TiAl, TiAlC, TaC, TaCN, TaSiN, TaAl, TaAlC, TiAlN, another n-type work function material, or combinations thereof. The contact metal layer (also referred to as a gap-filling metal layer) of the metal stack 416M can include a suitable conductive material, such as Al, W, and/or Cu.

The first and second devices 410 and 420 can further include spacers 418, which are disposed adjacent to (for example, along sidewalls of) the gate structure 412. The spacers 418 can be formed by any suitable process and include a dielectric material. The dielectric material can include silicon, oxygen, carbon, nitrogen, another suitable material, or combinations thereof (for example, silicon oxide, silicon nitride, silicon oxynitride, or silicon carbide). In some embodiments, the spacers 418 can include a multilayer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate structure 412.

Implantation, diffusion, and/or annealing processes can be performed to form lightly-doped source and drain (LDD) features and/or heavily-doped source and drain (HDD) features in the substrate 402 before and/or after the forming of the spacers 418.

In some embodiments, the source/drain structures 414 of the first deice 410 and the source/drain structures 422 of the second device 420 can include epitaxial structures EPI. For example, a semiconductor material is epitaxially grown on the substrate 402, forming epitaxial source/drain structures 414 and 422 over a source region and a drain region of the substrate 402. Accordingly, the gate structure 412, the epitaxial source/drain structure 414 and a channel region defined between the epitaxial source/drain structures 414 form the first device 410 such as a transistor. In some embodiments, the epitaxial source/drain structures 414 and 422 can surround source/drain regions of a fin structure. In some embodiments, the epitaxial source/drain structures 414 and 422 can replace portions of the fin structure. The epitaxial source/drain structures 414 and 422 are doped with n-type dopants and/or p-type dopants. In some embodiments, where the transistor is configured as an n-type device (for example, having an n-channel), the epitaxial source/drain structures 414 and 422 can include silicon-containing epitaxial layers or silicon-carbon-containing epitaxial layers doped with phosphorous, another n-type dopant, or combinations thereof (for example. Si:P epitaxial layers or Si:C:P epitaxial layers). In alternative embodiments, where the transistor is configured as a p-type device (for example, having a p-channel), the epitaxial source/drain structures 414 and 422 can include silicon-and-germanium-containing epitaxial layers doped with boron, another p-type dopant, or combinations thereof (for example, Si:Ge:B epitaxial layers). In some embodiments, the epitaxial source/drain structures 414 and 422 include materials and/or dopants that achieve desired tensile stress and/or compressive stress in the channel region. As mentioned above, elements mentioned above can be formed by FEOL processes; therefore, the first device 410 and the second device 420 can be referred to as the FEOL devices 110.

As shown in FIG. 4A, a first interlayer dielectric (ILD) structure 430 can be disposed over the substrate 402. The first ILD structure 430 can include a dielectric material including, for example, silicon oxide, silicon nitride, silicon oxynitride, TEOS formed oxide, PSG, BPSG, low-k dielectric material, another suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, another low-k dielectric material, and combinations thereof. As shown in FIG. 4A, the first ILD structure 430 may cover the first device 410 and the second device 420.

In operation 21 and 31, in some embodiments, a first conductive feature 432 is formed in the first region 404 and a second conductive feature 434 is formed in the second region 406. The first conductive feature 432 and the second conductive feature 434 are formed in the first ILD structure 430 and separated from each other, as shown in FIG. 4A. Further, the first conductive feature 432 is coupled to the first device 410, and the second conductive feature 434 is coupled to the second device 420. In some embodiments, as shown in FIG. 4A, the first conductive feature 432 is coupled to the source/drain structure 414 of the first device 410 while the second conductive feature 434 is coupled to the source/drain structure 422 of the second device 420. In some embodiments, the first conductive feature 432 and the second conductive feature 434 can be referred to as a metal-to-drain (MD) contact, which generally is referred to as a contact to a conductive region of a transistor, such as the source/drain structures 414 and 422, such that the source/drain structures 414 and 422 can be electrically connected to the BEOL interconnection through the conductive features 432 and 434. Accordingly, the FEOL structures 110 can be electrically connected to the BEOL interconnection through the conductive features 432 and 434, which also can be referred to as parts of the MEOL interconnect structures 120.

The first conductive feature 432 has a first width W1 and the second conductive feature 434 has a second width W2. In some embodiments, different regions have different dimension requirements. For example, the second width W2 of the second conductive feature 434 in the second region 406 (i.e., the IO region) is greater than the first width W1 of the first conductive feature 432 in the first region 404 (i.e., the memory array region). For example, the first width W1 of the first conductive feature 432 can be between approximately 15 nanometers and approximately 30 nanometers, while the second width W2 of the second conductive feature 434 can be between approximately 60 nanometers and approximately 300 nanometers, but the disclosure is not limited thereto. The first conductive feature 432 and the second conductive feature 434 can include a same metal material. In some embodiments, the first conductive feature 432 and the second conductive feature 434 can include cobalt (Co), tungsten (W) or ruthenium (Ru), but the disclosure is not limited thereto. Further, the first conductive feature 432 has a first metal grain size, and the second conductive feature 434 has a second metal grain size. In some embodiments, it is found that a metal grain size may be related to the width of the conductive features. For example, the second metal grain size of the second conductive feature 434, which has the second width W2 greater than the first width W1 of the first conductive feature 432, is greater than the first metal grain size of the first conductive feature 432. In some embodiments, the second metal grain size may be two times the first metal grain size, but the disclosure is not limited thereto.

In operation 21 and operation 31, the substrate 402 further includes a dielectric structure 440 over the first device 410, the second device 420, the first conductive feature 432, the second conductive feature 434 and the first ILD structure 430. In some embodiments, the dielectric structure 440 can be referred to as a second ILD structure. In some embodiments, the second ILD structure 440 may include a multi-layered structure that includes a plurality of dielectric layers. For example, the second ILD structure 440 can include a first dielectric layer 442 over the first ILD structure 430 and a second dielectric layer 444 over the first dielectric layer 442. In some embodiments, the second dielectric layer 444 can include materials substantially the same as those of the first ILD structure 430, but the disclosure is not limited thereto. In some embodiments, the material of the first dielectric layer 442 can be different from that of the first ILD structure 430 and the second dielectric layer 444, such that the first dielectric layer 442 may serve as an etch stop layer (ESL) or a contact etch stop layer (CESL), but the disclosure is not limited thereto. Additionally, a thickness of the second dielectric layer 444 can be greater than a thickness of the first dielectric layer 442.

Figure 4B:
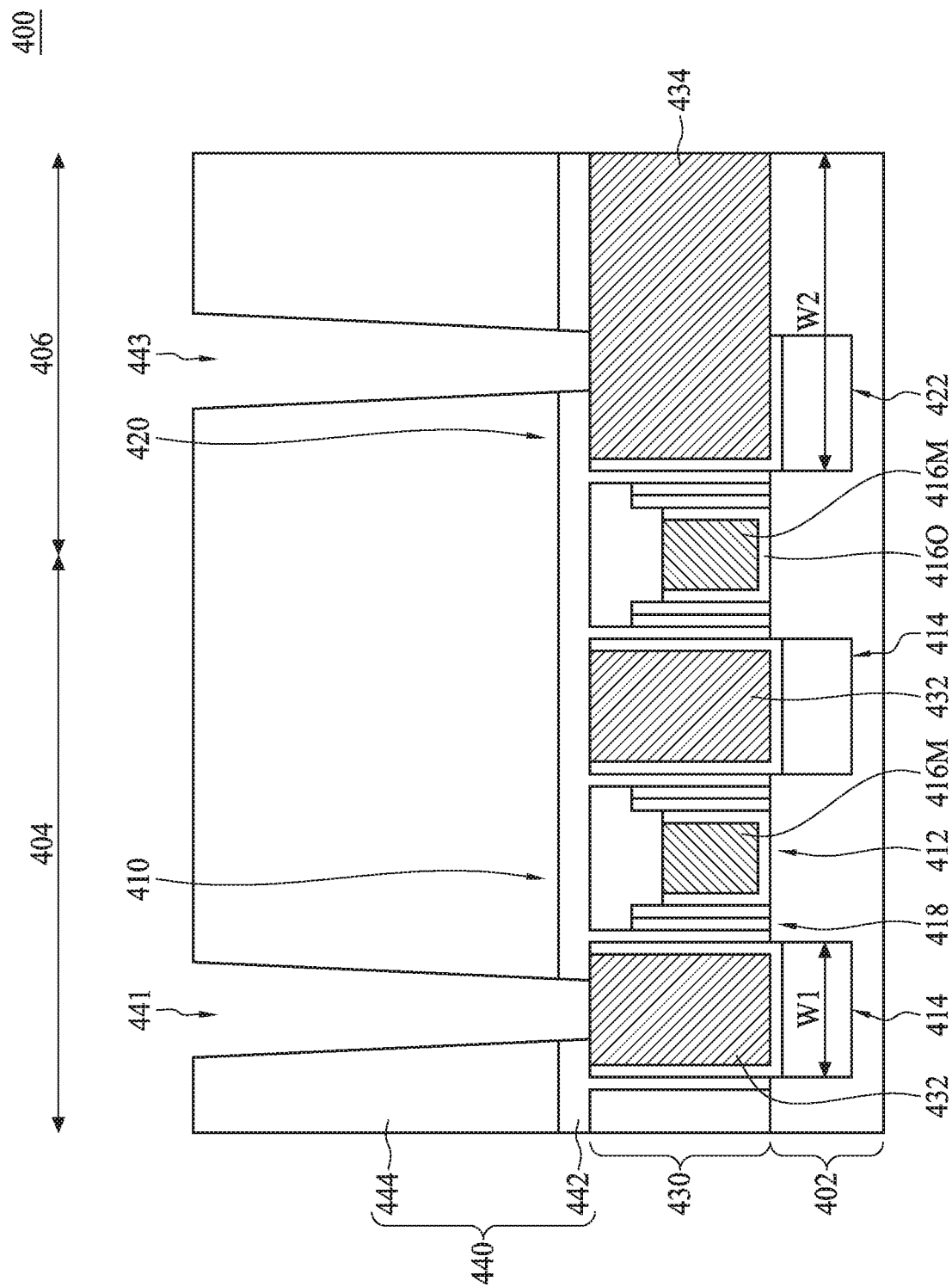

Referring to FIG. 4B, in operation 22, a first opening 441 and a second opening 443 are formed in the second ILD structure 440. In some embodiments, in operation 32, a dry-etching operation is performed to form the first opening 441 and the second opening 443 in the second ILD structure 440. In some embodiments, the dry-etching operation can include using a fluorine-containing (F-containing) plasma, but the disclosure is not limited thereto. Additionally, a typical lithographic operation with masking technologies can be used in operation 22 and operation 32. The dry-etching operation may be performed to remove portions of the second dielectric layer 444 and portions of the first dielectric layer 442, such that, as shown in FIG. 4B, the first opening 441 exposes a portion of the first conductive feature 432 and the second opening 443 exposes a portion of the second conductive feature 434. In other words, the first conductive feature 432 is exposed through a bottom of the first opening 441, and the second conductive feature 434 is exposed through a bottom of the second opening 443. In some embodiments, a width of the first opening 441 and a width of the second opening 443 can be substantially the same, but the disclosure is not limited thereto. In some embodiments, a depth of the first opening 441 and a depth of the second opening 443 are substantially the same, but the disclosure is not limited thereto. In some embodiments, the width of the first opening 441 and the width of the second opening 443 can be less than the first width W1 of the first conductive feature 432 and less than the second width of the second conductive feature 434. For example, the width of the first opening 441 and the width of the second opening 443 can be between approximately 10 nanometers and approximately 100 nanometers, but the disclosure is not limited thereto.

It should be noted that when the portions of the first and second conductive features 432 and 434 are exposed through the bottoms of the first and the second openings 441 and 443 in the dry-etching operation using the F-containing plasma, fluorine ions may react with the metal material of the exposed portions of the first and second conductive features 432 and 434 to form metal fluoride. The metal fluoride may be removed after the performing of the dry-etching operation and thus metal consumption is caused. Further, the metal consumption may form recesses respectively in the first and second conductive features 432 and 434, though not shown. It is found that such metal consumption may be related to the metal grain size. When a conductive feature has a smaller metal grain size, a wider and deeper recess may be formed in that conductive feature. In some comparative approaches, a recess may be formed in the first conductive feature 432 and a recess may be formed in the second conductive feature 434. It is found that when the second metal grain size of the second conductive feature 434 is two times the first metal grain size of the first conductive feature 432, the recess in the first conductive feature 432 has a width and a depth that are greater than those of the recess in the second conductive feature 434. In some embodiments, a depth difference ratio between a depth of the recess in the first conductive feature 432 and a depth of the recess in the second conductive feature 434 may be greater than 40%. In such comparative approaches, the recesses with depth uniformity issue may cause difficulty in subsequent operations.

Figure 4C:
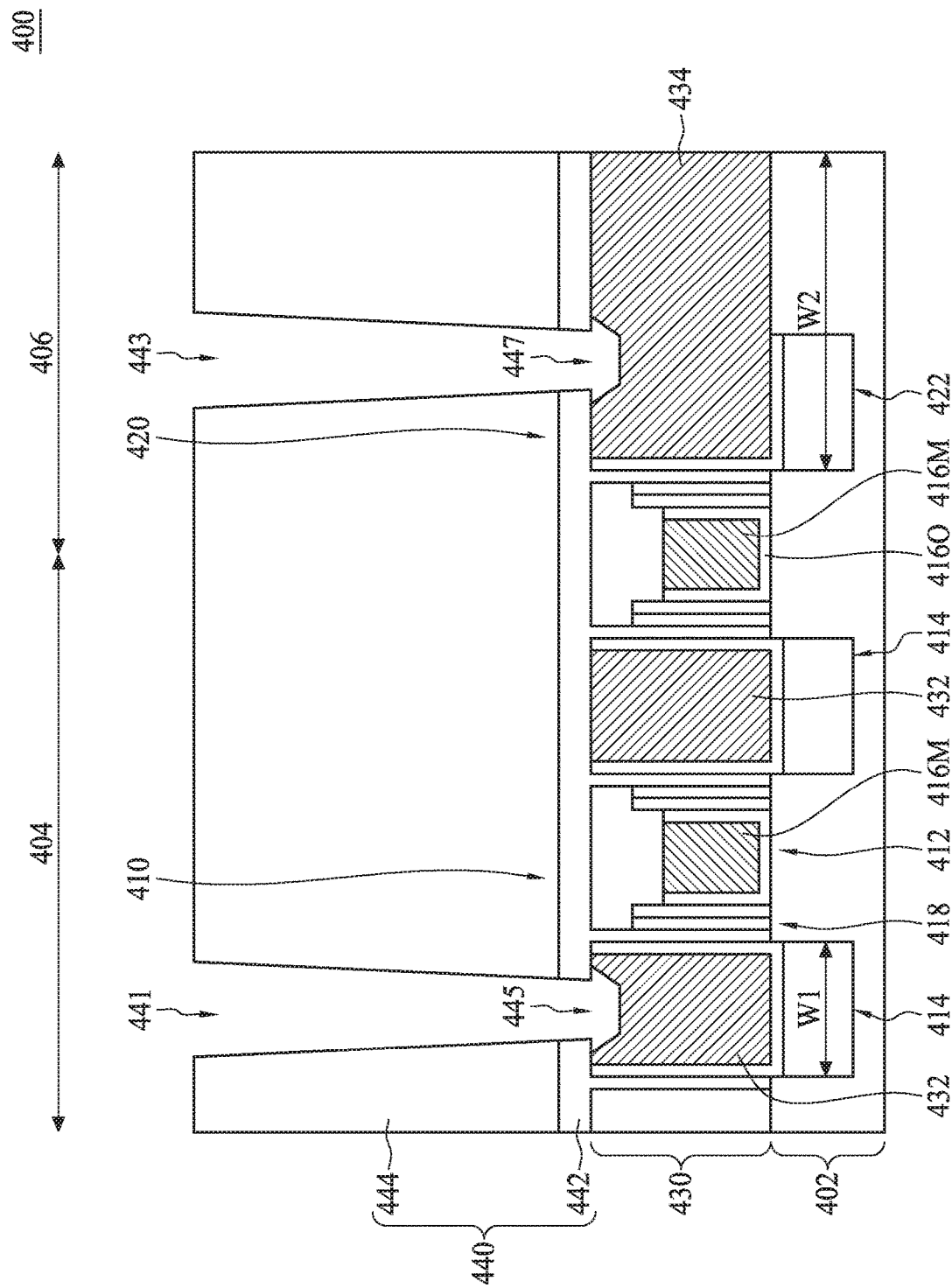

Referring to FIG. 4C, in operation 23, an etchant is used to remove a portion of the first conductive feature 432 to form a first recess 445 in the first conductive feature 432, and to remove a portion of the second conductive feature 434 to form a second recess 447 in the second conductive feature 434. In some embodiments, in operation 33, a wet-etching operation is performed to form the first recess 445 at the bottom of the first opening 441 and the second recess 447 at the bottom of the second opening 443. As shown in FIG. 4C, the first recess 445 is coupled to the first opening 441, and the second recess 447 is coupled to the second opening 443.

In some embodiments, an etchant used in the wet-etching operation includes ozone ($O_3$), ammonium hydroxide-hydrogen peroxide mixture (APM), ammonium hydroxide/ozone/DI water mixture (AOM), organic oxidizer, or a combination thereof.

For example, an etchant including $O_3$ and APM can be used in the wet etching operation. In such embodiments, a concentration of the $O_3$ in the etchant can be between approximately 1% and approximately 10%, and a concentration of the APM can be between approximately 1% and approximately 50%, but the disclosure is not limited thereto. In some embodiments, the etchant including $O_3$ and APM can further include an organic oxidizer. In such embodiments, a concentration of the organic oxidizer can be between approximately 1% and approximately 50%, but the disclosure is not limited thereto.

In other embodiments, the etchant used in the wet etching operation can include AOM, and a concentration of AOM can be between approximately 1% and approximately 10%, but the disclosure is not limited thereto. In such embodiments, the etchant including AOM can further include an organic oxidizer. In other embodiments, the etchant used in the wet etching operation can include AOM and $O_3$, such embodiments, a concentration of the $O_3$ in the etchant can be between approximately 1% and approximately 10%, and a concentration of the AOM can be between approximately 1% and approximately 10%, but the disclosure is not limited thereto. In such embodiments, the etchant including AOM and $O_3$ can further include an organic oxidizer.

In some embodiments, the wet etching operation can be performed at a temperature between approximately 23° C. and approximately 70° C., but the disclosure is not limited thereto. In some embodiments, the wet etching operation can be performed for a duration between approximately 1 minute and approximately 10 minutes, but the disclosure is not limited thereto.

In some embodiments, a depth of the first recess 445 and a depth of the second recess 447 are respectively between approximately 8 nanometers and approximately 12 nanometers, but the disclosure is not limited thereto. It should be noted that the compounds or mixtures used in the etchant are strong oxidants. Therefore, the metal materials of the first and second conductive features 432 and 434 may react with the oxidant to form metal oxide, which can be easily removed. Further, the reactions between the metal materials and the oxidant are unrelated to the metal grain size. Consequently, in some embodiments, a depth difference ratio between the depth of the first recess 445 and the depth of the second recess 447 can be less than approximately 10%. In other embodiments, the depth difference ratio between the depth of the first recess 445 and the depth of the second recess 447 can be less than approximately 8%. Additionally, a depth of the first opening 441 is greater than the depth of the first recess 445, and a depth of the second opening 443 is greater than the depth of the second recess 447, as shown in FIG. 4C.

Figure 4D:
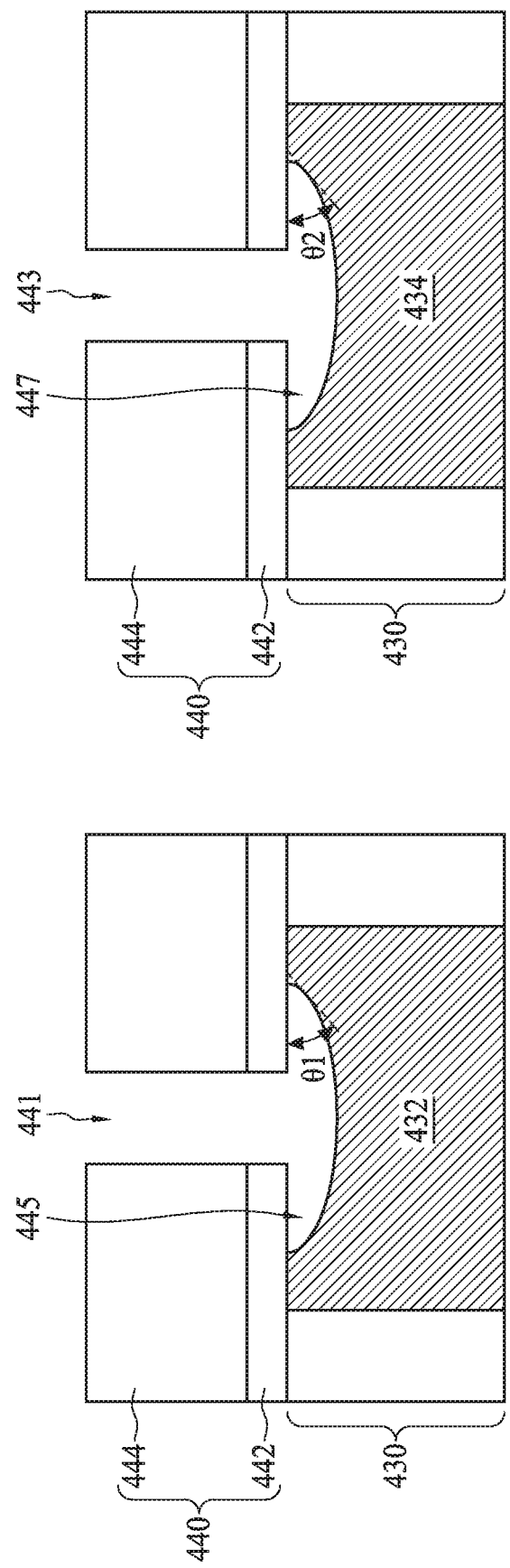

Referring to FIG. 4D, which is a partial enlarged view of the first recess 445 and the second recess 447, in some embodiments, a widest portion of the first recess 445 has a width greater than a width of the first opening 441, and a widest portion of the second recess 447 has a width greater than the width of the second opening 443. In some embodiments, the first conductive feature 432 is exposed through sidewalls and a bottom of the first recess 445, and the second conductive feature 434 is exposed through sidewalls and a bottom of the second recess 447. In some embodiments, the first recess 445 and the second recess 447 can include slanted sidewalls, as shown in FIG. 4C. An included angle θ1 may be formed between the slanted sidewall of the first recess 445 and the first dielectric layer 442, and an included angle θ2 may be formed between the slanted sidewall of the second recess 447 and the first dielectric layer 442. In some embodiments, the included angle θ1 can be between approximately 40° and approximately 60°, and the included angle θ2 can be between approximately 40° and approximately 60°, but the disclosure is not limited thereto. In some embodiments, the included angle θ1 and the included angle θ2 may be the same. In some alternative embodiments, the included angle θ1 and the included angle θ2 are different.

Figure 4E:
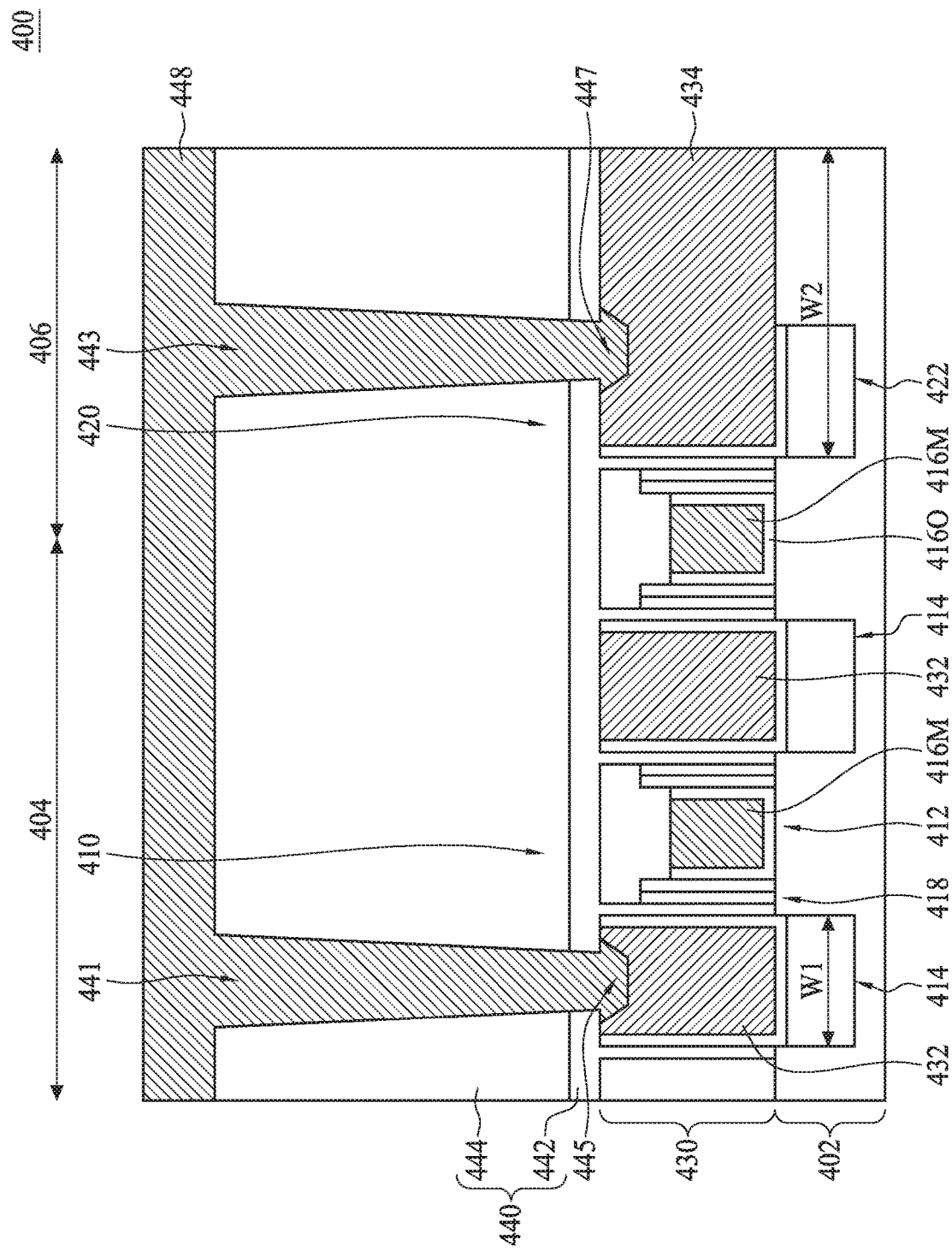

Referring to FIG. 4E, in operation 34, the first recess 445, the second recess 447, the first opening 441 and the second opening 443 are filled with a conductive material 448. In some embodiments, the conductive material can include copper (Cu), tungsten (W), ruthenium (Ru) and cobalt (Co). In some embodiment, the conductive material is different from the material of the first conductive feature 432 and the second conductive feature 434.

Figure 4F:
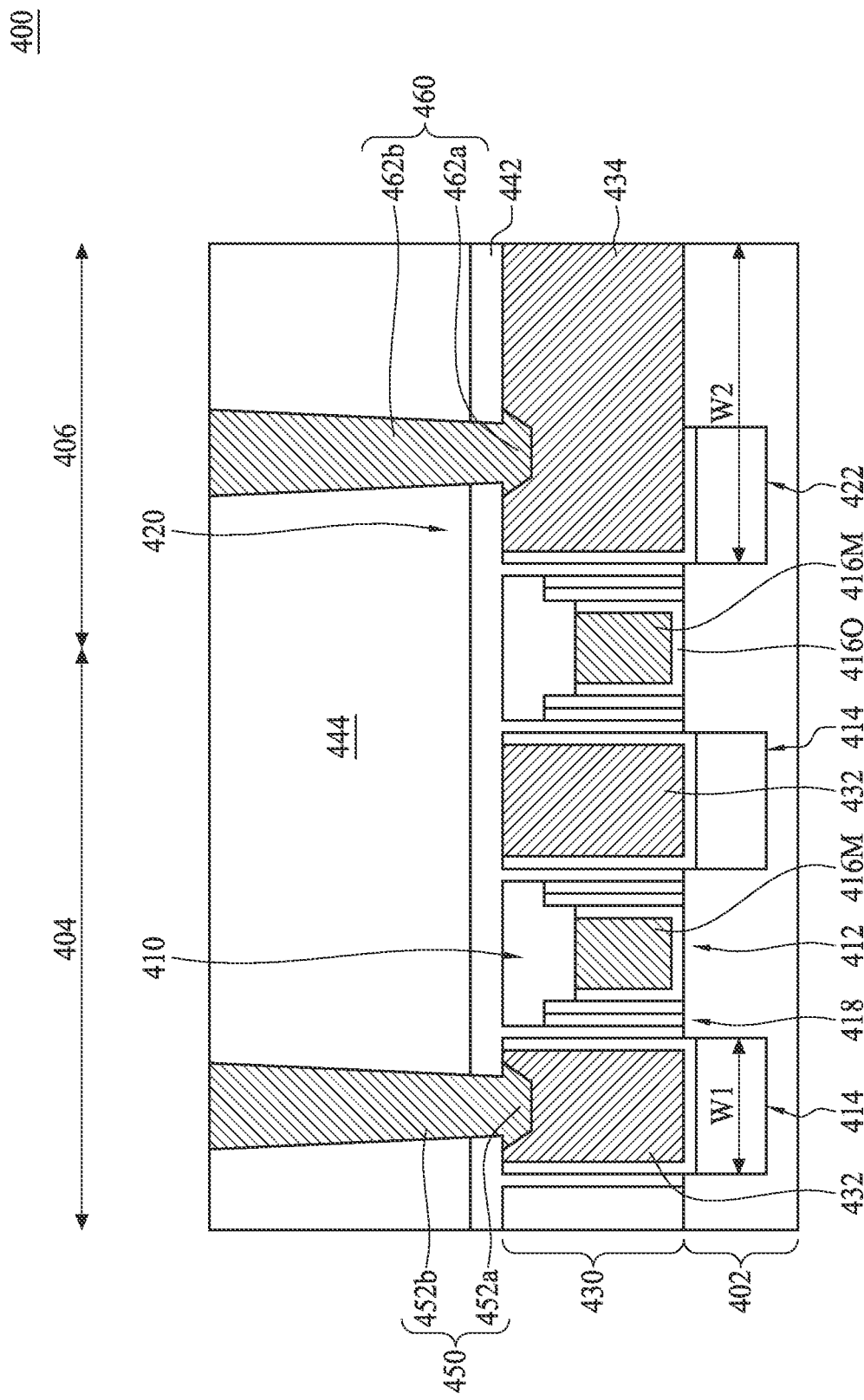

As shown in FIG. 4F, a planarization operation, such as a chemical-mechanical planarization (CMP) operation, may be performed to remove superfluous conductive material and a portion of the second ILD structure 440. Accordingly, in operation 24, a third conductive feature 450 is formed in the first opening 441 and the first recess 445, and a fourth conductive feature 460 is formed in the second opening 443 and the second recess 447. In some embodiments, CMP is carried out by placing the substrate 402 in a wafer carrier that presses the wafer surface to be polished against a polishing pad attached to a platen. The platen and the wafer carrier are counter-rotated while an abrasive slurry containing both abrasive particles and reactive chemicals is applied to the polishing pad. The slurry is transported to the wafer surface via the rotation of the polishing pad. The relative movement of the polishing pad and the wafer surface coupled with the reactive chemicals in the abrasive slurry allows CMP to level the wafer surface by means of both physical and chemical actions. In some embodiments, a slurry that is reactive to the second dielectric layer 444 and the conductive material is chosen. However, it is found that slurry may seep along an interface between the metal material and the second dielectric layer 444. In some comparative approaches, the slurry may consume the first and second conductive features 432 and 434 once it contacts the first and second conductive features 432 and 434. In some comparative approaches, portions of the first and second conductive features 432 and 434 may be removed and cause metal loss issue. In such comparative approaches, to mitigate this metal loss issue, the slurry used in the CMP has a requirement: it has to react with the metal material used to form the third and fourth conductive features 450 and 460 but also be non-reactive with the metal material used to form the first and second conductive features 432 and 434. Consequently, the planarization suffers from a narrow choice issue for the slurry.

To mitigate the metal loss issue and the narrow choice issue, the first recess 445 and the second recess 447 are provided. As shown in FIG. 4F, in some embodiments, the slurry may seep downwardly along the interface between the conductive material 448 and the second dielectric layer 444. However, the slurry may be blocked from the first and second conductive features 432 and 434 by the conductive material in the first recess 445 and the second recess 447. Therefore, the metal loss issue can be mitigated. Further, because the slurry may be blocked from the first and second conductive features 432 and 434, the feature of non-reactivity of metal material used to form the first and second conductive features 432 and 434 is no longer required, and thus the narrow choice issue is mitigated.

Accordingly, a connecting structure is 400 is obtained as shown in FIG. 4F. The connecting structure 400 includes the substrate 402 including the first region 404 and the second region 406, the first conductive feature 432 in the first region 404, the second conductive feature 434 in the second region 406, the third conductive feature 450 over and coupled to the first conductive feature 432, and the fourth conductive feature 460 over and coupled to the second conductive feature 434. As mentioned above, the connecting structure 400 may include the first device 410 in the first region 404 and the second device 420 in the second region 406. The details of the first device 410 and the second device 420 may be similar to those described above; therefore, such details are omitted herein in the interest of brevity. As shown in FIG. 4F, the first conductive feature 432 has the first width W1, and the second conductive feature 434 has the second width W2. In some embodiments, the second width W2 is greater than the first width W1. The first conductive feature 432 has the first metal grain size, and the second conductive feature 434 has the second metal grain size. As mentioned above, the metal grain size is related to the width of the first and second conductive features 432 and 434. For example, the second metal grain size of the second conductive feature 434, which has the second width W2 greater than the first width W1 of the first conductive feature 432, is greater than the first metal grain size of the first conductive feature 432. In some embodiments, the second metal grain size may be two times the first metal grain size, but the disclosure is not limited thereto. The first conductive feature 432 and the second conductive feature 434 include a same metal material. The third conductive feature 450 and the fourth conductive feature 460 include a same metal material. However, the metal material of the third and fourth conductive features 450 and 460 is different from that of the first and second conductive features 432 and 434.

In some embodiments, the third conductive feature 450 includes a first anchor portion 452a and a first vertical portion 452b over and coupled to the first anchor portion 452a. In some embodiments, a widest part of the first anchor portion 452a has a width greater than a width of the first vertical portion 452b. A depth of the first vertical portion 452b is greater than a depth of the first anchor portion 452a. In some embodiments, the fourth conductive feature 460 includes a second anchor portion 462a and a second vertical portion 462b over and coupled to the second anchor portion 462a. In some embodiments, a widest part of the second anchor portion 462a has a width greater than a width of the second vertical portion 462b. A depth of the second vertical portion 462b is greater than a depth of the second anchor portion 462a. A depth difference ratio between a depth of the first anchor portion 452a and a depth of the second anchor portion 462a is less than approximately 10%.

FIG. 4G is a partial enlarged view of the third conductive feature 450 and the fourth conductive feature 460. In some embodiments, an included angle θ1' is formed by a sidewall of the first anchor portion 452a and the first dielectric layer 442, and an included angle θ2' is formed by a sidewall of the second anchor portion 462a and the first dielectric layer 442. In some embodiments, the included angle θ1' can be between approximately 40° and approximately 60°, and the included angle θ2' can be between approximately 40° and approximately 60°, but the disclosure is not limited thereto. In some embodiments, the included angle θ1' and the included angle θ2' may be the same. In some alternative embodiments, the included angle θ1' and the included angle θ2' are different.

Figure 5:
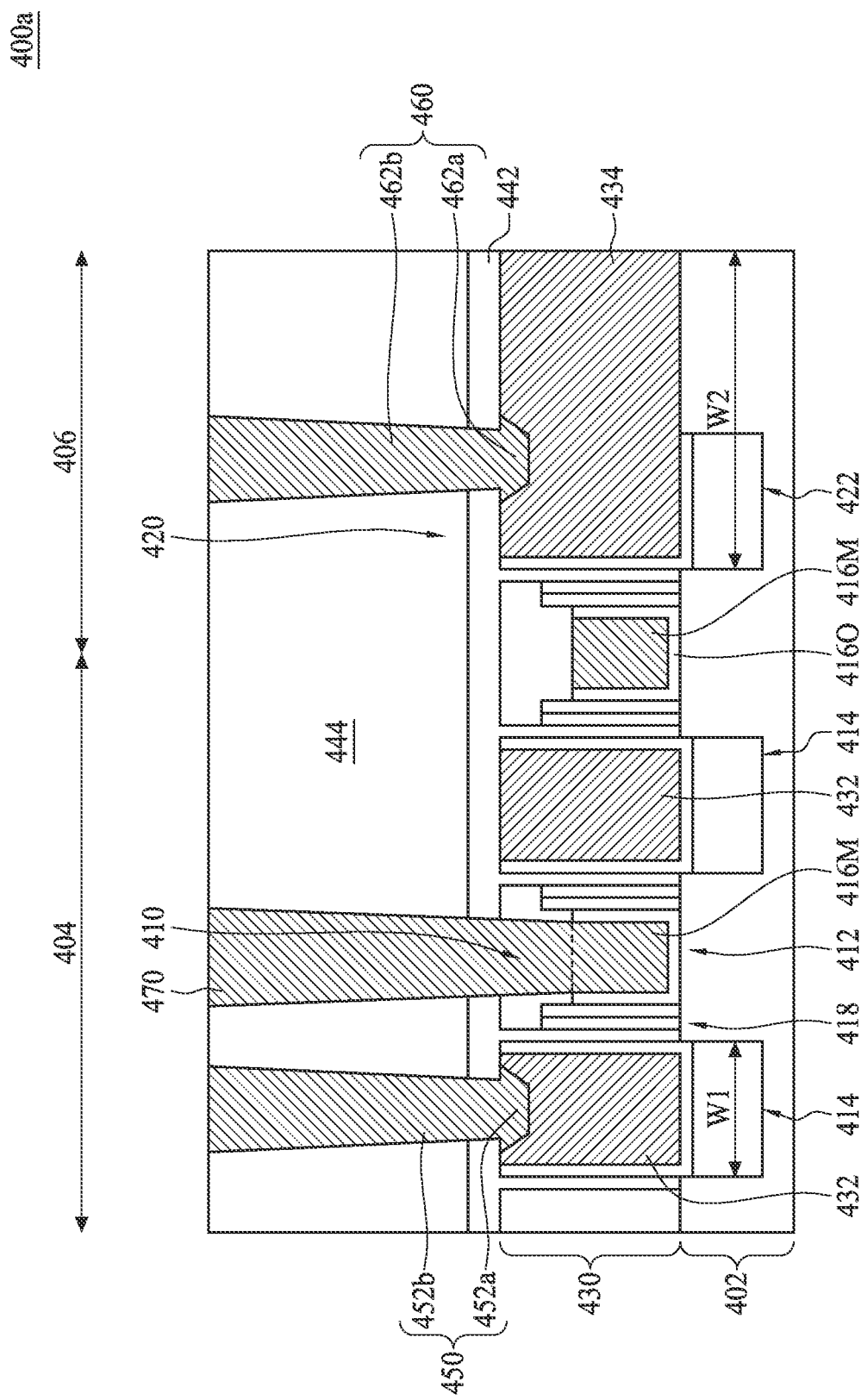
FIG. 5 is a schematic drawing illustrating a connecting structure according to aspects of one or more embodiments of the present disclosure.

FIG. 5 is a schematic drawing illustrating a connecting structure 400a It should be noted that same elements in FIGS. 4A to 4G and 5 are indicated by the same numerals, and details of the same elements shown in FIGS. 4A to 4G and 5 are omitted in the description of FIG. 5. As mentioned above, in some embodiments, at least the first device 410 can include a metal gate structure. The metal gate structure can include at least a work function metal layer (not shown) and a contact metal layer 416M. In some embodiments, the connecting structure 400a further includes a fifth conductive feature 470 disposed over and coupled to the metal gate structure. For example, the fifth conductive feature 470 can be coupled to the contact metal layer 416M of the metal gate structure. In some embodiments, the fifth conductive feature 470 can include a metal material the same as that of the third conductive feature 450 and the fourth conductive feature 460. Further, the fifth conductive feature 470 can include a metal material the same as that of the contact metal layer 416M of the metal gate structure. In some embodiments, the first conductive feature 432 and the second conductive feature 434 include a same first metal material, while the contact metal layer 416M of the metal gate structure, the third conductive feature 450, the fourth conductive feature 460 and the fifth conductive feature 470 include a same second metal material. Further, the second metal material is different from the first metal material.

In summary, the present disclosure provides a method for forming a connecting structure that uses a wet-etching operation to remove portions of the conductive features. A removal rate of the wet-etching operation is un-related to a metal grain size of the conductive features, while the metal grain size is related to widths of the conductive features. In some embodiments, an etchant used in the wet-etching operation is a strong oxidizer, which can react with the metal materials. Further, the reactions between the metal materials and the oxidant are unrelated to the metal grain size. Consequently, recesses having a depth difference ratio of less than approximately 10% can be obtained. In contrast to the comparative approaches, which have depth difference ratios greater than 40%, the recess uniformity can be improved by the wet-etching operation. Further, the recesses can be filled with the conductive material to form anchor portions of conductive features, which help to mitigate the bottom metal issue during CMP.

In some embodiments, a connecting structure is provided. The connecting structure includes a substrate, a first conductive feature, a second conductive feature, a third conductive feature over the first conductive feature and a fourth conductive feature over the second conductive feature. The substrate includes a first region and a second region. The first conductive feature is disposed in the first region and has a first width. The second conductive feature is disposed in the second region and has a second width greater than the first width of the first conductive feature. The third conductive feature includes a first anchor portion surrounded by the first conductive feature. The fourth conductive feature includes a second anchor portion surrounded by the second conductive feature. In some embodiments, a depth difference ratio between a depth of the first anchor portion and a depth of the second anchor portion is less than approximately 10%.

In some embodiments, a method for forming a connecting structure is provided. The method includes following operations. A substrate is received. The substrate includes a first conductive feature and a second conductive feature separated from each other. The substrate further includes a dielectric structure disposed over the first conductive feature and the second conductive feature. In some embodiments, a width of the second conductive feature is greater than a width of the first conductive feature. A first opening and a second opening are formed in the dielectric structure. The first conductive feature is exposed through the first opening, and the second conductive feature is exposed through the second opening. An etchant is used to remove a portion of the first conductive feature to form a first recess coupled to the first opening and to remove a portion of the second conductive feature to form a second recess coupled to the second opening. In some embodiments, a depth difference ratio between a depth of the first recess and a depth of the second recess is less than approximately 10%. A third conductive feature is formed in the first opening and the first recess, and a fourth conductive feature is formed in the second opening and the second recess.

In some embodiments, a method for forming a connecting structure is provided. The method include following operations. A substrate is received. The substrate includes a first device, a second device, a first conductive feature coupled to the first device, a second conductive feature coupled to the second device, and a dielectric structure over the first device, the second device, the first conductive feature and the second conductive feature. In some embodiments, a width of the second conductive feature is greater than a width of the first conductive feature. A dry-etching operation is performed to form a first opening and a second opening in the dielectric structure. The first opening exposes a portion of the first conductive feature, and the second opening exposes a portion of the second conductive feature. A wet-etching operation is performed to form a first recess at a bottom of the first opening and a second recess at a bottom of the second opening. In some embodiments, a depth difference ratio between a depth of the first recess and a depth of the second recess is less than approximately 10%. The first recess, the second recess, the first opening and the second opening are filled with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a connecting structure, comprising:
   receiving a substrate comprising a first conductive feature and a second conductive feature separated from each other, and a dielectric structure over the first conductive feature and the second conductive feature, wherein a width of the second conductive feature is greater than a width of the first conductive feature, wherein the first conductive feature has a first metal grain size, the second conductive feature has a second metal grain size, and the second metal grain size is greater than the first metal grain size;
   forming a first opening and a second opening in the dielectric structure, wherein the first conductive feature is exposed through a bottom of the first opening, and the second conductive feature is exposed through a bottom of the second opening;
   using an etchant to remove a portion of the first conductive feature to form a first recess coupled to the first opening, and to remove a portion of the second conductive feature to form a second recess coupled to the second opening, wherein a depth of the first recess and a depth of the second recess are similar, and an etching rate to the first conductive feature and an etching rate to the second conductive feature are similar; and
   forming a third conductive feature in the first opening and the first recess, and a fourth conductive feature in the second opening and the second recess.

2. The method of claim 1, wherein the first conductive feature and the second conductive feature comprise a same metal material, and the third conductive feature and the fourth conductive feature comprise a same metal material.

3. The method of claim 2, wherein the first conductive feature and the third conductive feature comprise different material, and the second conductive feature and the fourth conductive feature comprise different material.

4. The method of claim 1, wherein the etchant comprises ozone ($O_3$), ammonium hydroxide-hydrogen peroxide mixture (APM), ammonium hydroxide/ozone/DI water mixture (AOM), organic oxidizer or a combination thereof.

5. The method of claim 1, wherein a width of the first opening and a width of the second opening are substantially the same, a width of the first recess is greater than the width of the first opening, and a width of the second recess is greater than the width of the second opening.

6. The method of claim 1, wherein a depth of the first opening and a depth of the second opening are substantially the same, the depth of the first opening is greater than the depth of the first recess, and the depth of the second opening is greater than the depth of the second recess.

7. The method of claim 1, further comprising performing a dry-etching operation to form the first opening and the second opening in the dielectric structure.

8. A method for forming a connecting structure, comprising:
   receiving a substrate comprising a first device, a second device, a first conductive feature coupled to the first device, a second conductive feature coupled to the second device, and a dielectric structure over the first device, the second device, the first conductive feature and the second conductive feature, wherein a width of the second conductive feature is greater than a width of the first conductive feature, wherein the first conductive feature has a first metal grain size, the second conductive feature has a second metal grain size, and the second metal grain size is greater than the first metal grain size;
   performing a dry-etching operation to form a first opening and a second opening in the dielectric structure, wherein the first opening exposes a portion of the first conductive feature and the second opening exposes a portion of the second conductive feature;
   performing a wet-etching operation to form a first recess at a bottom of the first opening and a second recess at a bottom of the second opening, wherein a depth of the first recess and a depth of the second recess are similar, and an etching rate to the first conductive feature and an etching rate to the second conductive feature are similar; and
   filling the first recess, the second recess, the first opening and the second opening with a conductive material.

9. The method of claim 8, wherein the dry-etching operation comprises using a fluorine-containing plasma.

10. The method of claim 8, wherein the wet-etching operation comprises using ozone ($O_3$), ammonium hydroxide-hydrogen peroxide mixture (APM), ammonium hydroxide/ozone/DI water mixture (AOM), organic oxidizer or a combination thereof.

11. The method of claim 8, wherein the first device comprises a first source/drain structure, the second device comprises a second source/drain structure, the first conductive feature is coupled to the first source/drain structure, and the second conductive feature is coupled to the second source/drain structure.

12. The method of claim 8, wherein the first conductive feature and the second conductive feature comprise a same metal material, wherein the conductive material includes a third conductive feature and a fourth conductive feature, wherein the third conductive feature and the fourth conductive feature comprise a same material.

13. The method of claim 12, wherein the first conductive feature and the third conductive feature comprise different material, and the second conductive feature and the fourth conductive feature comprise different material.

14. A method for forming a connecting structure, comprising:
   receiving a substrate having a first conductive feature, a second conductive feature and a dielectric structure formed thereon, wherein a width of the first conductive feature is less than a width of the second conductive feature, wherein the first conductive feature has a first metal grain size, the second conductive feature has a second metal grain size, and the second metal grain size is greater than the first metal grain size;

performing a first etching operation to form a first opening and a second opening in the dielectric structure, wherein a portion of the first conductive feature is exposed through a bottom of the first opening and a portion of the second conductive feature is exposed through a bottom of the second opening;

performing a second etching operation to form a first recess coupled to the first opening and a second recess coupled to the second opening, wherein a depth of the first recess and a depth of the second recess are similar, and an etching rate to the first conductive feature and an etching rate to the second conductive feature are similar; and forming a third conductive feature in the first opening and the first recess and a fourth conductive feature in the second opening and the second recess.

15. The method of claim 14, wherein the first conductive feature and the second conductive feature comprise a same metal material, and the third conductive feature and the fourth conductive feature comprise a same material.

16. The method of claim 15, wherein the first conductive feature and the third conductive feature comprise different material, and the second conductive feature and the fourth conductive feature comprise different material.

17. The method of claim 14, wherein a width of the first opening and a width of the second opening are substantially the same.

18. The method of claim 14, wherein a width of the first recess is greater than a width of the bottom of the first opening, and a width of the second recess is greater than a width of the bottom of the second opening.

19. The method of claim 14, wherein the first etching operation is a dry-etching operation, and the second etching operation is a wet-etching operation.

20. The method of claim 19, wherein the dry-etching operation comprises using a fluorine-containing plasma.

* * * * *